United States Patent [19]
Arimoto

[11] Patent Number: 5,959,918
[45] Date of Patent: Sep. 28, 1999

[54] SEMICONDUCTOR MEMORY DEVICE HAVING IMPROVED MANNER OF DATA LINE CONNECTION IN HIERARCHICAL DATA LINE STRUCTURE

[75] Inventor: Kazutami Arimoto, Hyogo, Japan

[73] Assignee: Mitsubishi Denki Kabushiki Kaisha, Tokyo, Japan

[21] Appl. No.: 09/203,475

[22] Filed: Dec. 2, 1998

Related U.S. Application Data

[62] Division of application No. 08/840,469, Apr. 18, 1997, which is a division of application No. 08/440,022, May 12, 1995, Pat. No. 5,657,286.

[30] Foreign Application Priority Data

Jun. 8, 1994 [JP] Japan .................................. 6-126250

[51] Int. Cl.[6] .................................................. G11C 7/00
[52] U.S. Cl. .................. 365/205; 365/189.01; 365/207; 365/208; 365/190; 365/204
[58] Field of Search ................................. 365/205, 203, 365/204, 189.01, 207, 208, 190

[56] References Cited

U.S. PATENT DOCUMENTS

| | | |
|---|---|---|
| 5,193,076 | 3/1993 | Houston . |
| 5,293,343 | 3/1994 | Raab et al. . |
| 5,333,121 | 7/1994 | Geib . |
| 5,392,242 | 2/1995 | Koike . |
| 5,436,910 | 7/1995 | Takeshima et al. . |
| 5,452,252 | 9/1995 | Wada . |
| 5,500,820 | 3/1996 | Nakaoka . |
| 5,521,878 | 5/1996 | Ohtami et al. . |
| 5,657,275 | 8/1997 | Yoshida . |
| 5,657,286 | 8/1997 | Arimoto .................................. 365/205 |
| 5,680,365 | 10/1997 | Blankenship ....................... 365/230.05 |
| 5,822,257 | 10/1998 | Ogawa ..................................... 365/200 |
| 5,831,924 | 11/1998 | Nitta et al. .......................... 365/230.03 |

FOREIGN PATENT DOCUMENTS

| | | |
|---|---|---|
| 61-31867 | 5/1994 | Japan . |
| 6-187782 | 7/1994 | Japan . |
| 62-203552 | 7/1994 | Japan . |

OTHER PUBLICATIONS

"A 40NS 64MB DRAM With Current–Sensing Data–Bus Amplifier", Masao Taguchi et al., Feb. 1991, IEEE International Solid–State Circuits Conference, pp. 112–113.
"A LSV Circuit Technology For 64MB DRAMS", Y. Nakogome et al., 1990 Symposium on VLSI Circuits, pp. 17–18.

*Primary Examiner*—Viet Q. Nguyen
*Attorney, Agent, or Firm*—McDermott, Will & Emery

[57] ABSTRACT

Segment data line pairs connected to a bit line pair are separated into segment data line pair for reading, and segment data line pair for writing. Global data line pairs connected to segment data line pair are separated into global data line pair for reading and global data line pair for writing. Connection between bit line pair and segment data line pair for reading is provided through a first read amplifier, while segment data line pair for reading is connected to global data line pair for reading through a second read amplifier. The first read amplifier includes two MOS transistors connected in series between one of the segment data line pair for reading and the ground power supply, and two MOS transistors connected in series between the other one of the segment data line pair for reading and the ground power supply. The second read amplifier includes two MOS transistors connected in series between one of the global data line pair for writing and the ground power supply, and two MOS transistors connected in series between the other one of the global data line pair for writing and the ground power supply.

19 Claims, 16 Drawing Sheets

SEMICONDUCTOR MEMORY DEVICE HAVING IMPROVED MANNER OF DATA LINE CONNECTION IN HIERARCHICAL DATA LINE STRUCTURE

This application is a divisional of application Ser. No. 08/840,469 filed Apr. 18, 1997, which is a divisional of application Ser. No. 08/440,022 filed May 12, 1995, now U.S. Pat. No. 5,657,286.

BACKGROUND OF THE INVENTION

1. Field of the Invention

The present invention relates to a semiconductor memory device and, more specifically, to a dynamic type semiconductor memory device (hereinafter referred to as a "DRAM") having a hierarchical data line structure.

2. Description of the Background Art

FIG. 11 is a block diagram showing an example of a general DRAM structure.

Referring to the figure, in a DRAM 200, a plurality of word lines WL and a plurality of bit line pairs BL (one each is shown in the figure) are arranged crossing each other in a memory cell array 201, and at each crossing between the word line and each bit line of the bit line pair, a memory cell is provided. Based on a row address signal input to row address buffer 202, a row decoder 203 is driven, and one word line is selected. Based on a column address signal input to column address buffer 204, a column decoder 205 is driven, and one bit line pair is selected. A memory cell at a crossing between the thus selected one word line and one of the bit lines of the selected bit line pair is selected. Data is written to the selected memory cell, or data stored in the memory cell is read. Designation of writing/reading of data is performed by a read/write control signal (R/W) applied to a control circuit 208. At the time of data writing, input data (Din) is input to a memory cell which is selected through an I/O circuit 207. Meanwhile, in data reading, data which has been stored in the selected memory cell is detected and amplified by a sense amplifier 206, and externally output as output data (Dout) through I/O circuit 207.

FIG. 12 shows a portion of two sets of bit line pairs of a conventional DRAM, and circuit structure of one bit line pair only is given in detail.

Referring to the figure, a plurality of word lines WL are arranged crossing bit line pair BLa, BLb, and at a crossing between each bit line BLa or BLb and each word line WL, a memory cell MC is provided. In the figure, only one memory cell MCa connected to bit line BLa and one memory cell MCb connected to bit line BLb are shown, and other memory cells are omitted. Each memory cell MC includes a transfer transistor Qs and a memory capacitor C. Transistor Qs is connected between bit line BLa or BLb and memory capacitor C, with its gate connected to word line WL.

To the bit lines BLa and BLb, an N type sense amplifier NSA and a P type sense amplifier PSA are connected. N type sense amplifier NSA includes N channel KOS transistors Q1 and Q2. Transistor Q1 is connected between bit line BLb and a node N1, with its gate connected to bit line BLa. Transistors Q2 is connected between bit line BLa and node N1, with its gate connected to bit line BLb. Node N1 is coupled to a ground potential through an N channel MOS transistor Q3, and a sense amplifier activating signal ϕSN is applied to the gate of transistor Q3. P type sense amplifier PSA includes P channel MOS transistors Q4 and Q5. Transistor Q4 is connected between bit line BLb and a node N2, with its gate connected to bit line BLa. Transistor Q5 is connected between bit line BLa and node N2, with its gate connected to bit line BLb. Node N2 is connected to a power supply potential Vcc through a P channel MOS transistor Q6, and a sense amplifier activating signal ϕSP is applied to the gate of transistor Q6. Further, an N channel MOS-transistor Q7 is connected between bit line pair BLa and BLb, and an equalizing signal BLEQ is applied to the gate thereof.

Reading operation by the circuit shown in FIG. 12 will be described with reference to a timing chart of FIG. 13.

When a low active row address strobe signal RAS (hereinafter referred to as "$\overline{RAS}$") is at the "H" level, that is, in an off time period, sense amplifier activating signal ϕSN attains to the "H" level, sense amplifier activating signal ϕSP attains to the "L" level, and sense amplifiers NSA and PSA are active. Therefore, potential of one of the bit line pair BLa and BLb is kept at "H" level, and the potential of the other one is kept at the "L" level.

When row address strobe signal $\overline{RAS}$ is at the "L" level, that is, in an active period, first, sense amplifier activating signal ϕSN is set to the "L" level, and sense amplifier activating signal ϕSP is set to the "H" level. Thus sense amplifiers NSA and PSA are set to an inactive state, and then equalizing signal BLEQ is once set to the "H" level, so that bit line pair BLa and BLb are short-circuited. Consequently, the potentials of bit lines BLa and BLb both attain to an intermediate potential, that is, "precharge potential", which is intermediate between the "H" level and "L" level. Equalizing signal BLEQ is returned to the "L" level, and then a word line driving signal OWL rises to the "H" level. Accordingly, information of a memory cell MC connected to the selected word line WL is read to the corresponding bit line BLa or BLb, and the potential of bit line BLa or BLb slightly rises or falls in accordance with the information of the memory cell MC. At this time, the potential of the bit line BLa or BLb to which the selected memory cell MC is not connected, is kept at the aforementioned precharge potential. Thereafter, sense amplifier activating signal ϕSN is set to the "H" level, sense amplifier activating signal JSP is set to the "L" level, and sense amplifiers NSA and PSA are activated, whereby potential difference between bit lines BLa and BLb is amplified. As a result, one of the pair of bit lines BLa and BLb having higher potential is fixed at the "H" level, and one having lower potential is fixed at the "L" level. At this state, column decoder 205 is driven, turning on N channel MOS transistors Q7 and Q8 provided between a desired bit line and input/output lines I/Oa and I/Ob. Consequently, potential difference between the desired bit line pair is taken out through one pair of input/output lines I/Oa and I/Ob connected to I/O circuit 207, and thus reading operation is performed.

Thereafter, when row address strobe signal $\overline{RAS}$ rises to the "H" level, the active period terminates, and word line driving signal ϕWL falls to the "L" level. Consequently, transistor Qs of the memory cell MC connected to the selected word line WL turns off. However, sense amplifiers NSA and PSA are held at the active state until the start of the next active period. When row address strobe signal $\overline{RAS}$ attains to the "L" level, starting the active period, the aforementioned operation is again performed.

Writing operation is performed in the manner reverse to the reading operation. Specifically, when write data is applied to I/O circuit 207, one of the input/output lines I/Oa and I/Ob attains to the "H" level, and the potential of the other attains to the "L" level. At this state, column decoder 205 is driven, turning on transistors Q7 and Q8 connected to the desired bit line pair. Consequently, the potentials of input/output lines I/Oa and I/Ob are transmitted to the desired bit line pair, so that one bit line is set to the "H" level and the other bit line is set to the "L" level. At this time, when the potentials appearing on the bit line pair are reversed, sense amplifiers are inverted forcefully, so that each of the bit lines are kept at the desired potential. Meanwhile, by driving the row decoder, one word line is selected, a transistor Qs of the memory cell positioned at the crossing of the word line and the bit line is turned on, and thus the capacitor C and the corresponding bit line are conducted. In this manner, the potential appearing on a desired bit line is kept in a memory cell MC determined by the selection of a desired word line, and thus writing operation is performed.

FIG. 14 shows a structure of a DRAM in which memory array 201 of FIG. 11 is divided into a plurality of sub memory arrays and which includes hierarchical data lines.

Referring to the figure, twelve sub memory arrays 201a-1 to 201d-3 are shown in the figure, arranged in a matrix. A row decoder 203a is provided corresponding to memory arrays 201a-1 to 201a-3, and similarly, row decoders 203b to 203d are provided on the left end of the blocks of respective corresponding sub memory arrays. In a space along the longitudinal direction of each of the sub memory arrays, segment data line pairs SI/Oa and SI/Ob are arranged connected to the bit line pair BLa and BLb provided in the sub memory array, and in a space along the lateral direction of each of the sub memory arrays, global data line pairs GI/Oa and GI/Ob are arranged, to which segment data lines are connected. At end portions of global data line pairs GI/Oa and GI/Ob, preamplifiers PA1 to PA3 are connected.

The operation of the DRAM will be briefly described. As the row decoder is driven, a word line WL of each sub memory array is selected, and the data read from the bit line pair BLa and BLb is read to segment data line pair SI/Oa and SI/Ob. The data read to the segment data line pair is further transferred to the global data line pair GI/Oa and GI/Ob, amplified in preamplifier PA1 and externally output as memory information.

Meanwhile, in the writing operation, data taken from the outside is transferred to the bit line pair of the sub memory array through global data line pair GI/Oa and GI/Ob and segment data line pair SI/Oa and SI/Ob, a desired word line WL is selected by the row decoder, and thus the data is written to a desired memory cell.

As the storage capacity of the memory cell is increased, hierarchical data line structure has been proposed for dissipating capacitance of data lines, in order to external input/output of data on the data lines at high speed, with the memory array divided into a plurality of sub memory arrays.

FIGS. 15 and 16 show conventionally proposed hierarchical data line structures disclosed in ISSCC 91 *Digest of Technical Papers* pp. 112–113.

These figures show a hierarchical data line structure based on one bit line pair in each sub memory array.

Referring to FIG. 15, bit lines BLa and BLb are connected at nodes N3a and N3b to segment data line pair SI/Oa and SI/Ob through N channel MOS transistors T1a and T1b, and receiving at their gates a column signal Y, respectively. Segment data lines SI/Oa and SI/Ob are connected at nodes N4a and N4b to data lines of global data line pair GI/Oa and GI/Ob through N channel transistors T2a and T2b, respectively, the transistors receiving at their gates a sub memory array selecting signal BS. The global data line has one end connected to a Din buffer 73 through a write drive 71, so as to receive data input from an external terminal Din. Meanwhile, each of the nodes N5a and N5b of the global data line is connected to a main amplifier MA through a preamplifier PA, and provides data externally through an external terminal Dout. In this manner, in the hierarchical data line structure of FIG. 15, segment data lines and global data lines are provided by SI/O line pair and GI/O pair commonly used for reading/writing operations. The bit line and segment data line are switched by column decoder signal Y, while the segment data line and the global data line are switched by the control signal BS. However, in this structure, potential difference between the bit line pair is transferred through a transfer gate to the segment data line and the global data line. Therefore, the length of the data lines as a whole is long, and potential difference at the end of the global data lines is reduced, due to the additional capacitance of the data lines. Therefore, it takes much time to amplifier the data at the preamplifier PA.

FIG. 16 shows another conventional hierarchical data line structure.

Referring to the figure, the structure differs from the hierarchical data line structure shown in FIG. 15 in that the segment data lines for reading and writing are provided separately. More specifically, bit line pair BLa and BLb are connected at nodes N7a and N7b through N channel MOS transistors T5a and T5b, which receive at their gates a read column signal YW, and through a read amplifier RA, to segment data line pair SWBa and SWBb for writing.

Read amplifier RA includes N channel MOS transistors T3a and T4a connected in series between the ground potential and a node N6a of one segment data line SRBa of the pair for reading, and N channel MOS transistors T3b and T4b connected in series between the ground potential and a node N6b of the other segment data line SRBb of the pair for reading. One bit line BLa of the bit line pair is connected to the gate of transistors T3a, and the other bit line BLb of the bit line pair is connected to the gate of transistors T3b. A column signal YR for reading is input to the gates of transistors T4a and T4b.

Segment data line pair SRBa and SRBb for reading are connected at nodes N9a and N9b to global data lines GI/Oa and GI/Ob through N channel MOS transistors T7a and T7b, respectively, to the gates of which transistors the read control signal BSR is input. Segment data line pair SWBa and SWBb for writing are connected at nodes N8a and N8b to global data lines GI/Oa and GI/Ob through N channel MOS transistors T6a and T6b, to the gates of which transistors a write control signal BSW is input. Except these points, the structure is the same as that shown in FIG. 15.

In this hierarchical data line structure, the read data of the bit line pair is amplified by read amplifier RA and transmitted to segment data lines SRBa and SRBb for reading, while write data is written through segment data lines SWBa and SWBb for writing and transfer gates T5a and T5b, which are controlled by column signal YW for writing, to bit line pair BLa an BLb. The segment data line pair for reading and the global data line pair are switched by the read control signal BSR, while segment data line pair for writing and the global data line pair are switched by write control signal BSW. Increase in speed of data reading/writing operations in the hierarchical data line structure is discussed in 1990 *Symposium on VLSI Circuit Digest of Technical Papers* pp. 17–18.

However, the above described hierarchical data line structures are not sufficient to further increase the speed of operation of semiconductor memory devices having ever increasing storage capacity, and the above described structures are not satisfactory also in view of the area occupied by the data pairs.

SUMMARY OF THE INVENTION

An object of the present invention is to increase speed of writing/reading operations in a semiconductor memory device having hierarchical data line structure.

Another object of the present invention is to increase speed of writing/reading operation while reducing area occupied by the data line pairs, in a semiconductor memory device having hierarchical data line structure.

The above described objects can be attained by a semiconductor memory device having a hierarchical data line structure in accordance with the present invention which includes a first data line pair to which a plurality of memory cells and a sense amplifier are connected; a second data line pair connected to the first data line pair, used for data writing; a third data line pair connected to the first data line pair through a first read amplifier, used for data reading; a fourth data line pair connected to the second data line pair, for taking external data; and a fifth data line pair connected to the third data line through a second read amplifier, for externally providing data.

In the semiconductor memory device structured as described above, the data lines of the first layer and the data lines of the second layer connected to the first data line pair are both separated for reading and writing, and therefore necessary transition time between reading and writing operations can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
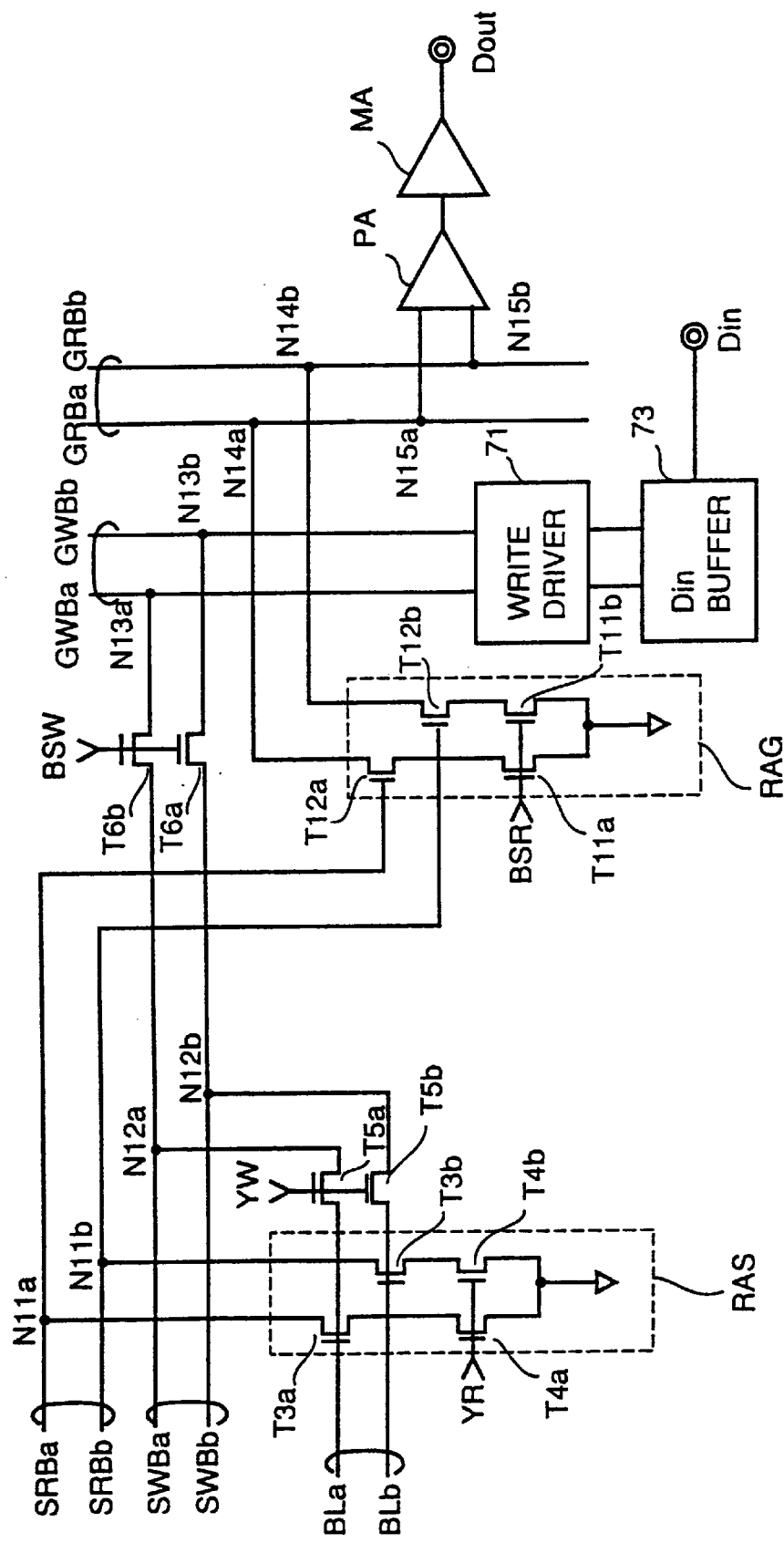
FIG. 1 shows a hierarchical data line structure in accordance with a first embodiment of the present invention.

FIG. 1 is a schematic diagram showing a hierarchical data line structure in accordance with a first embodiment of the present invention. For simplicity of description, only a hierarchical data line structure based on one bit line pair is shown in the figure.

Segment data line pairs connected to the bit line pair and global data line pairs connected to the segment data line pairs are both provided separately for reading and writing. Specific structure will be described.

Bit line pair BLa and BLb are connected at nodes N12a and N12b to segment data line pair SWBa and SWBb for writing, through N channel MOS transistors T5a and T5b, to the gates of which column decoder signal YW for writing is input, and through a read amplifier RAS.

Read amplifier RAS includes N channel transistors T3a and T4a connected in series between the ground potential and node N11a of one SRBa of the segment data line pair for reading, and N channel MOS transistors T3b and T4b connected in series between the ground potential and node N11b of the other one SRBb of the segment data line pair for reading. Bit line BLa is connected to the gate of transistor T3a, and bit line BLb is connected to the gate of transistor T3b. Column decoder signal YR for reading is input to the gates of transistors T4a and T4b.

Segment data line pair SRBa and SRBb are connected to nodes N14a and N14b of global data line pair GRBa and GRBb for reading, through read amplifier RAG. Read amplifier RAG includes N channel MOS transistors T12a and T11a connected in series between the ground potential and node N14a, and N channel MOS transistors T12b and T11b connected in series between the ground potential and node N14b. Segment data line SRBa for reading is connected to the gate of transistor T12a, and segment data line SRBb is connected to the gate of transistor T12b. Sub memory array selecting signal BSR for reading is input to the gates of transistors T11a and T11b.

Segment data line pair SWBa and SWBb are connected to nodes N13a and N13b of global data line pair GWBa and GWBb for writing through N channel MOS transistors T6a and T6b, to the gate of which sub memory array selecting signal BSW for writing is input. Nodes N15a and N15b of global data line pair GRBa and GRBb for reading are connected to preamplifier PA, and the output of preamplifier PA is connected through main amplifier MA to output terminal Dout. Global data line pair GWBa and GWBb for writing are connected to a Din buffer 73 through a write buffer 71, and Din buffer 73 is connected to an input terminal Din.

Reading and writing operations in the hierarchical data line structure will be described.

First, at the start of reading operation, the bit lines BLa and BLb of the bit line pair are amplified by the sense amplifier, so that potential of one bit line attains to the "H"

level and the potential of the other bit line attains to the "L" level. For convenience of description, it is assumed that bit line BLa attains to the "H" level and the potential of bit line BLb attains to the "L" level, respectively. Then, transistor T3a to which gate bit line BLa is connected, turns on, while transistor T3b is kept off. Meanwhile, in reading operation, column decoder signal YR for reading attains to the "H" level, turning transistors T4a and T4b both on. Therefore, transistors T3a and T4a connected in series between node N11a and the ground potential are both turned on, whereby the potential of one data line SRBa of the segment data line pair for reading which has been precharged to a prescribed potential lowers, while segment data line SRBb is kept at the precharge potential.

In this manner, the potential appearing on the bit line pair is amplified by read amplifier RAS as the change in potentials of the segment data line pair. The potential difference appearing at segment data line pair SRBa and SRBb is similarly amplified by read amplifier RAG, and transmitted to global data line pair GRBa and GRBb for reading. As transistor T12a turns off and transistor T12b turns on, the potential at global data line GRBa for reading attains to the "H" level, and the potential at global data line GRBb for reading attains to the "L" level. The potential difference appearing at the global data line pair for reading is further amplified by preamplifier PA and main amplifier MA, and externally output from terminal Dout.

Read amplifier RAG is activated by the sub memory array selecting signal BSR for reading. As is apparent from the layout of FIG. 14, additional capacitance of the global data lines for reading is larger than that of segment data line for reading.

In writing operation, data input from terminal Din is once held in Din buffer 73, and then transferred to write buffer 71. The data appears as the potential difference between global data line pair GWBa and GWBb for writing. For simplicity of description, in this example, it is assumed that the potential of global data line GWBa for writing is at the "H" level, while the potential on global data line GWBb for writing is at the "L" level.

When writing operation starts, sub memory array selecting signal BSW for writing attains to the "H" level, turning on the transistors T6a and T6b serving as the transfer gates. Consequently, the potential difference appearing at global data line pair for writing is transferred as the potential difference between segment data line pair SWBa and SWBb for writing. More specifically, in this example, the potential at segment data line SWBa for writing attains to the "H" level, and the potential at segment data line SWBb for writing attains to the "L" level. At this state, column decoder signal YW for writing attains to the "H" level, turning on transistors T5a and T5b, so that the potential at the segment data line pair for writing is transferred to bit line pair BLa and BLb, thus realizing writing operation.

As segment data line pair and global data line pair for writing and reading are separately provided, additional capacitance of data lines can be reduced, and the speed of accessing the data lines can be improved. In this embodiment, bit line pair and the segment data line pair as well as the segment data line pair and the global data line pair are connected indirectly in reading operation, by providing read amplifiers.

Figure 15:
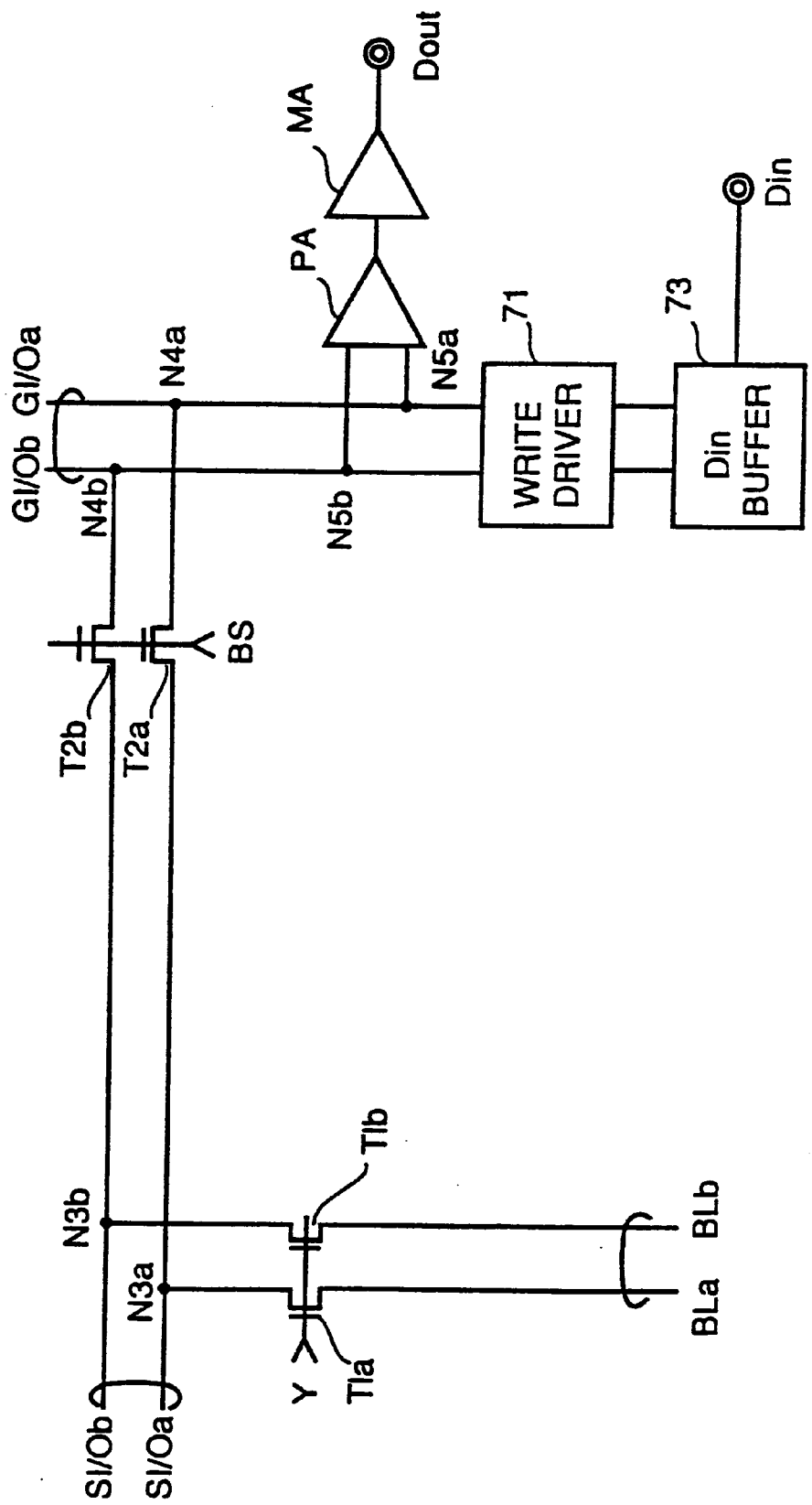
FIG. 15 shows an example of a conventional hierarchical data line structure.

The advantage of this embodiment will be described. In comparison with the conventional example shown in FIG. 15. In the structure of FIG. 15, the bit line pair is connected to the segment I/O line pair, and each of the segment I/O line pair is maintained at the precharge potential. Therefore, the potential difference appearing at bit line pair BLa and BLb at the start of reading operation is gradually amplified to a prescribed level by the sense amplifier. Therefore, during this amplification, when column decoder signal Y for reading is selected and transistors T1a and T1b are turned on, it is possible in some cases that the precharge potential of the segment I/O line flows in reverse direction to one of the bit lines which is amplified to the lower potential side, causing difficulty in reading operation. Therefore, in the prior art example of FIG. 15, it is necessary to turn on the column decoder signal Y after the potential difference of the bit line pair is fully amplified, which leads to delay in reading operation.

In the structure of FIG. 1 in which potential difference appearing at the bit line pair is amplified by a read amplifier and transmitted to segment data line pair, the above described problem can be avoided. More specifically, the potential amplified at the bit line pair gradually renders conductive the transistor T3a or T3b, and thus the potential of the segment data line pair immediately starts changing. Since the bit line pair is not directly connected to the segment data line pair for reading, there is not a possibility of reverse flow of the potential at the segment data line pair to the bit line pair, which was encountered in the prior art, whereby the column decoder signal YR for reading can be immediately set to the "H" level. This increases speed of reading operation.

Figure 12:
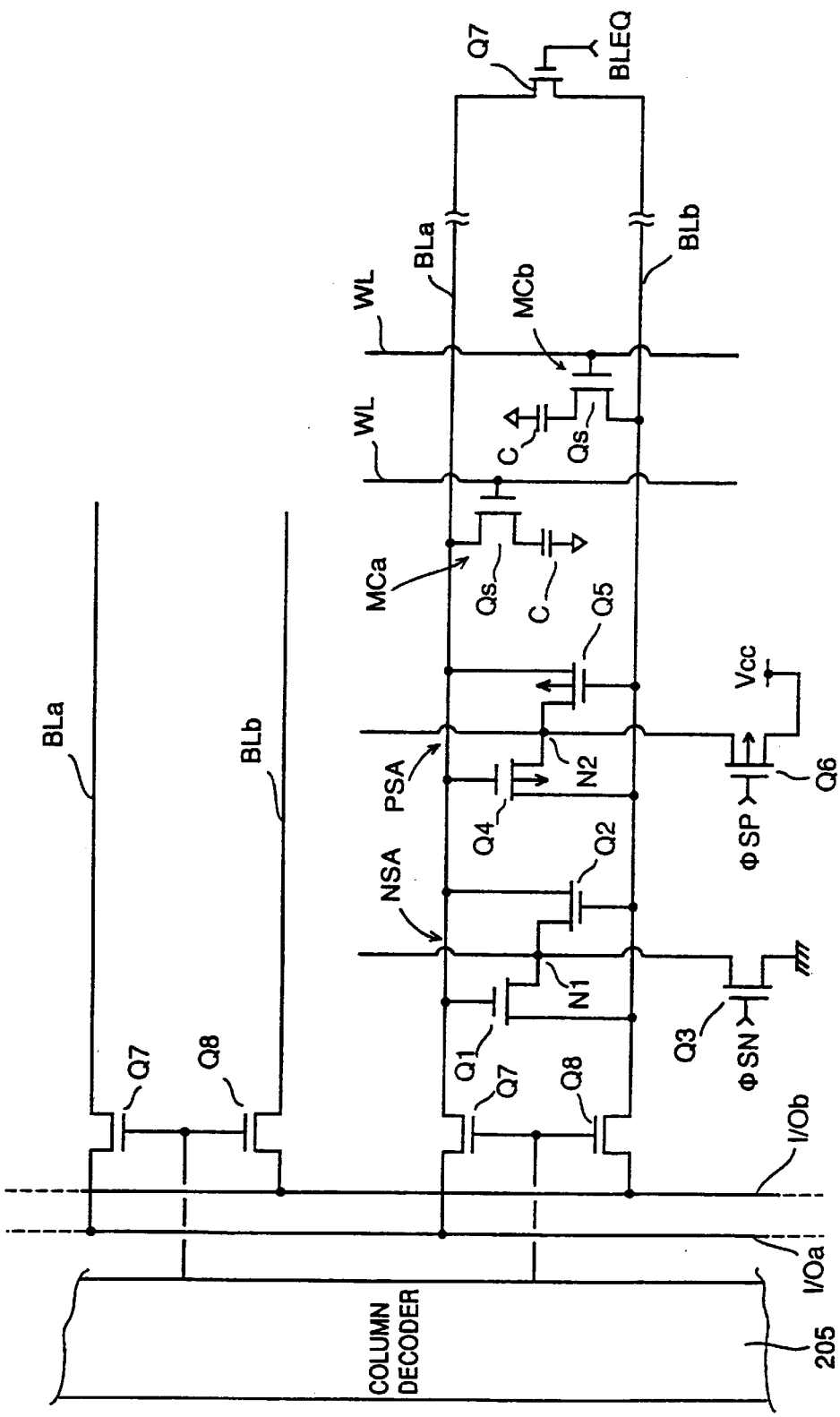
FIG. 12 is a schematic diagram showing a bit line pair structure of a general DRAM.
Figure 13:
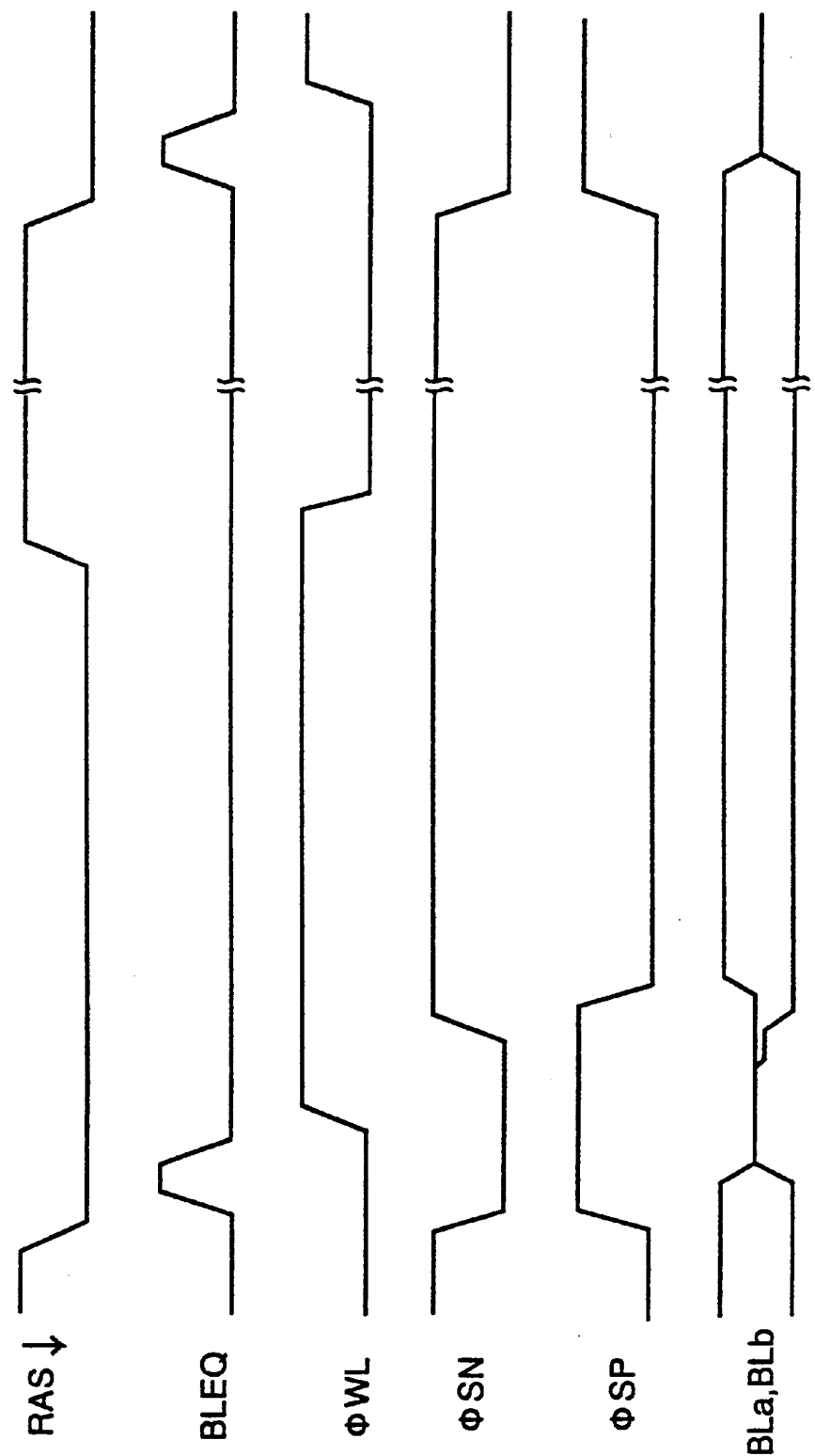
FIG. 13 is a timing chart showing the operation of the circuit shown in FIG. 12.

The advantage of the structure in accordance with the present embodiment at the transition from the reading operation to the writing operation will be described with reference to FIG. 12, in comparison with the prior art example shown in FIG. 15.

Figure 2:
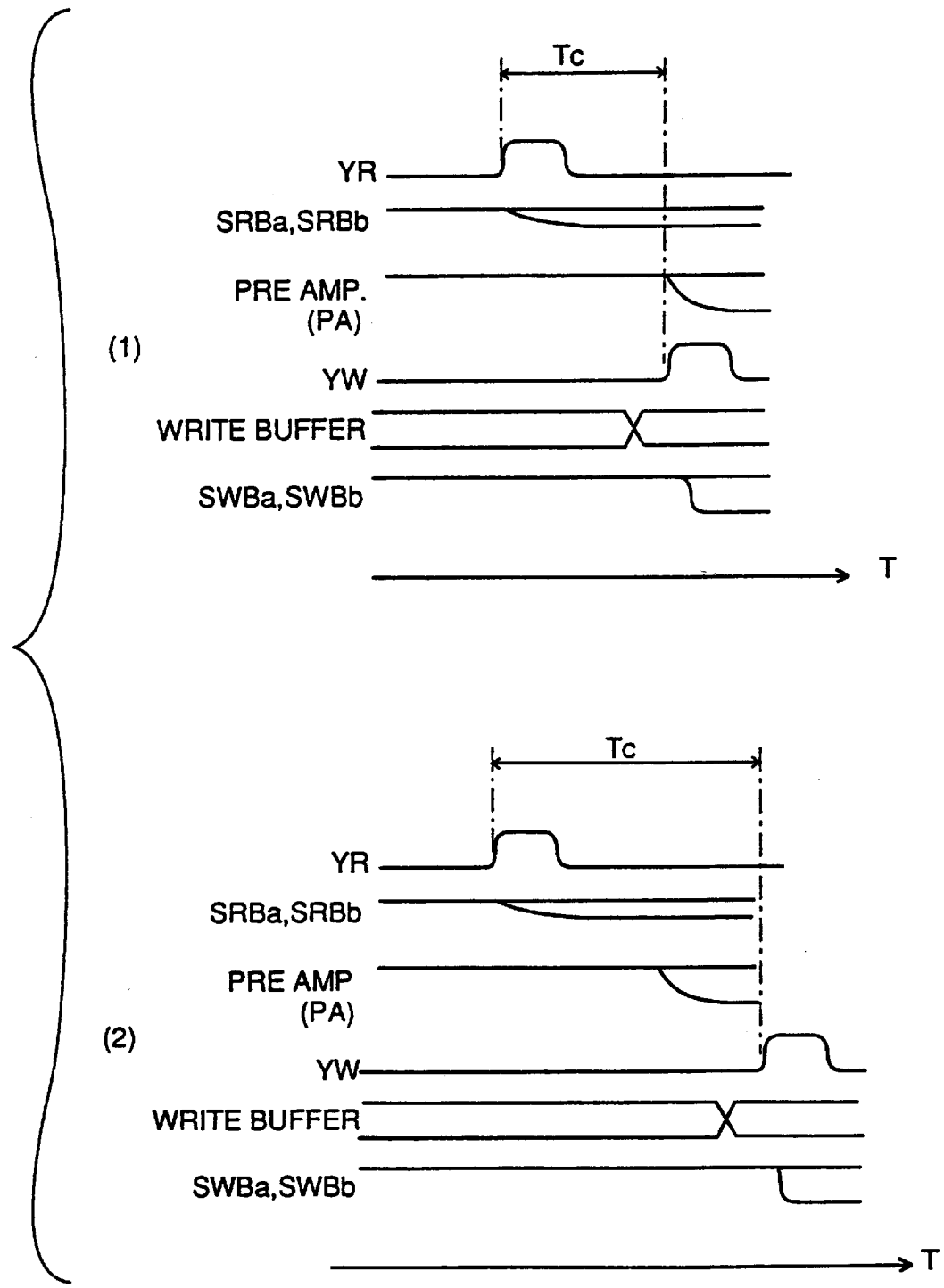
FIG. 2 is a timing chart for comparing transition time in the embodiment of FIG. 1 with transition time in the conventional hierarchical data line structure shown in FIG. 16.

(1) of FIG. 2 is a timing chart showing changes in various signals at the transition from the reading operation to the writing operation, in the structure in accordance with the first embodiment of the present invention.

Referring to the figure, when column decoder signal YR for reading attains to the "H" level at the start of reading operation, potential of one of the segment data line pair SRBa and SRBb for reading lowers to be lower than the precharge potential. This causes change in potential of the global data line for reading through read amplifier RAG. Based on this change, amplification takes place in preamplifier PA. Amplification of segment data lines for reading is performed, and when column decoder signal YR for reading attains to the "L" level, the states of potentials at the segment data line pair for reading and at the global data line pair for reading are kept as they are. Therefore, the operation can be immediately switched to the writing operation. More specifically, the transition time Tc necessary from the start of reading operation to the start of writing operation can be represented as shown in the figure.

Figure 16:
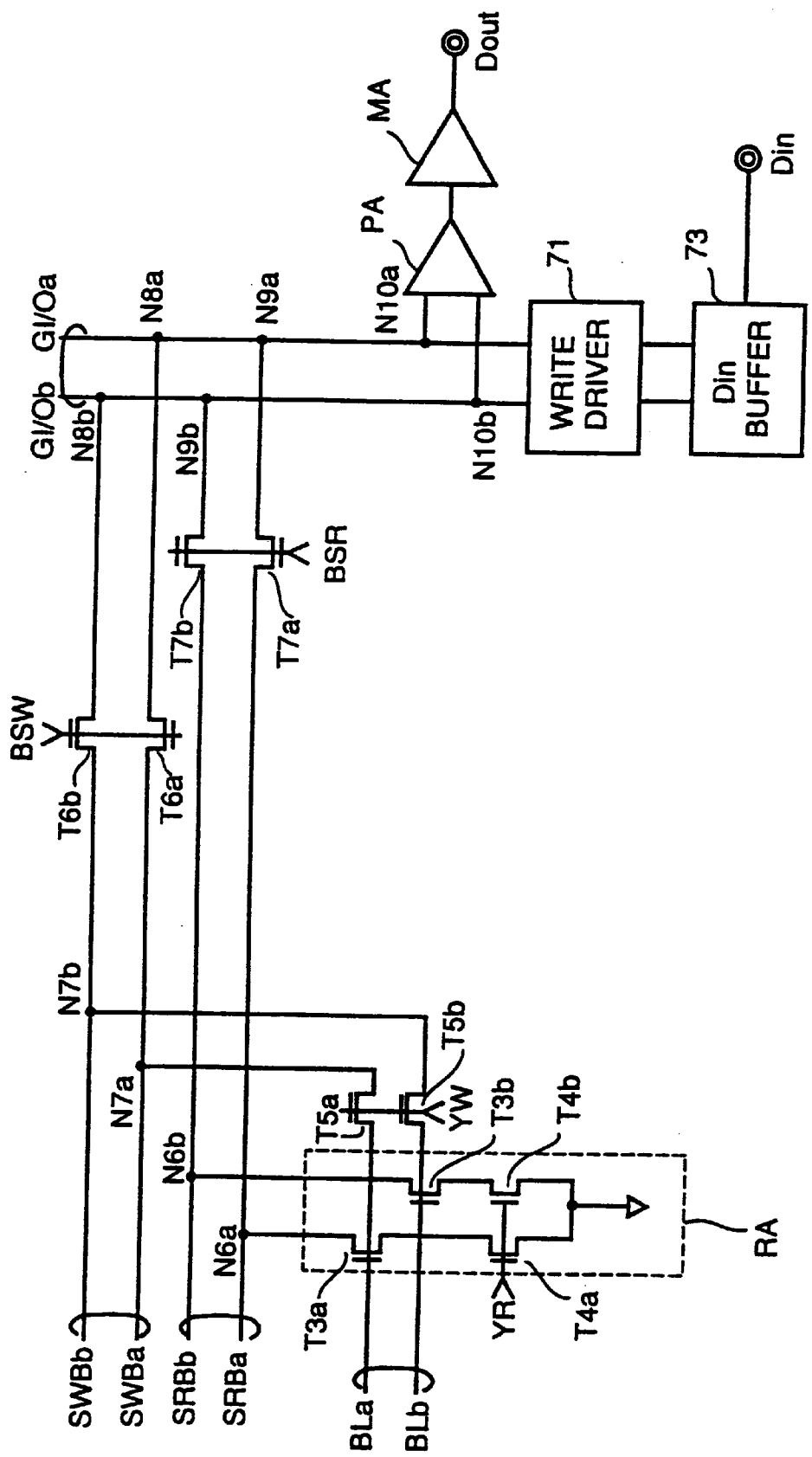
FIG. 16 shows another example of a conventional hierarchical data line structure.

(2) of FIG. 2 is a timing chart showing changes in various signals at the transition from the reading operation to the writing operation in the structure of the conventional example shown in FIG. 16.

Referring to the figure, when reading operation is performed and the potential difference at the bit line pair appears at the global I/O line pair and amplified by preamplifier PA, writing operation cannot be started yet. More specifically, the global I/O line pair can be used as the data line for writing operation not until amplification by preamplifier PA is completed and read data is latched there. Therefore, column decoder signal YW for writing attains to the "H" level after the completion of the operation of preamplifier PA. Therefore, transition time Tc in the structure of FIG. 16 is represented as shown in the figure, which is longer than the transition time Tc (shown on (1) of FIG. 2 in accordance with the embodiment of FIG. 1.

Though transition time from reading operation to the writing operation has been described, it is apparent that the transition time from writing operation to the reading operation in accordance with the first embodiment is shorter than that in the conventional example of FIG. 16.

Figure 3:
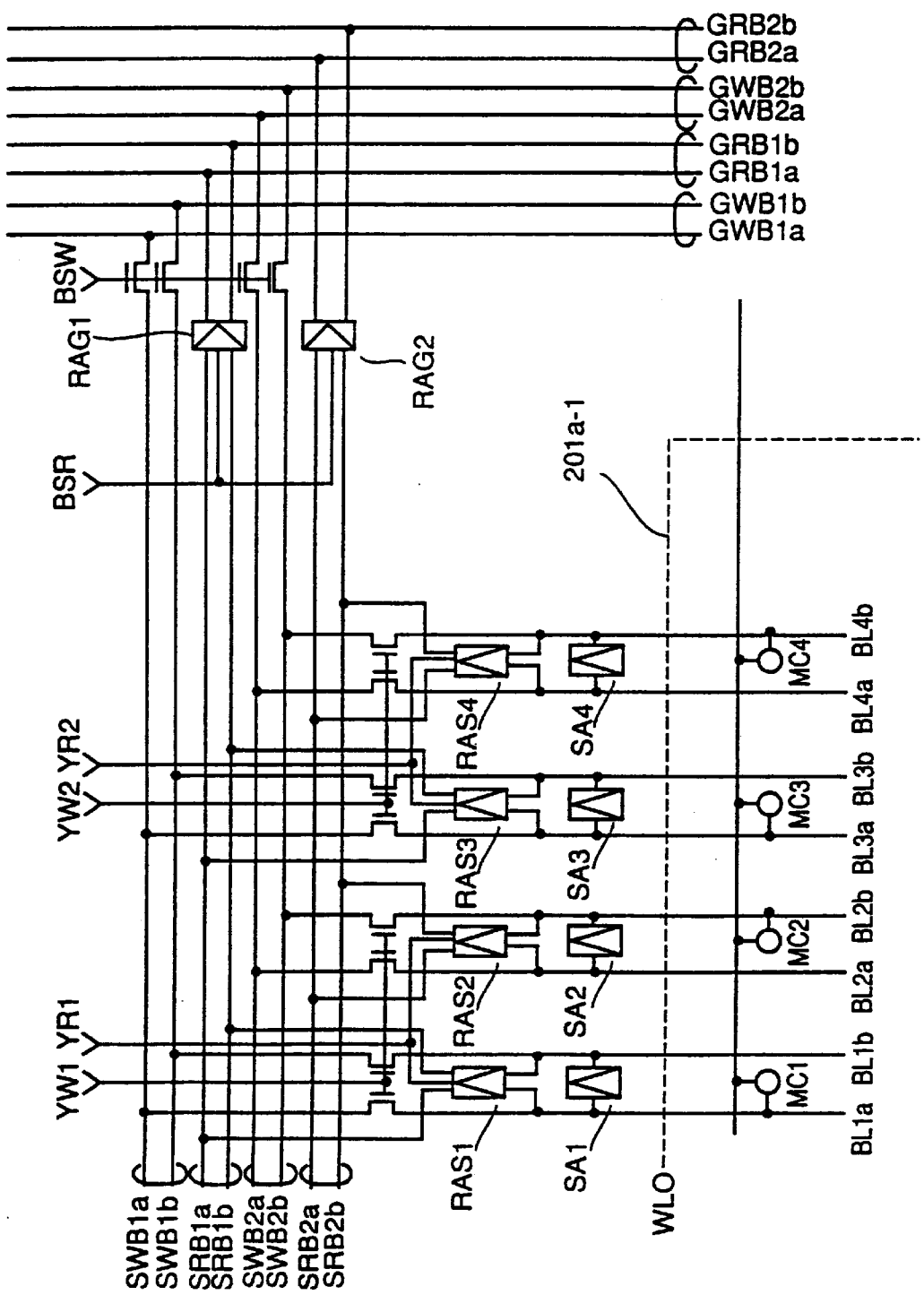
FIG. 3 shows a circuit structure of the first embodiment of the present invention in which a plurality of bit line pairs and a plurality of segment data line pairs are provided.
Figure 4:
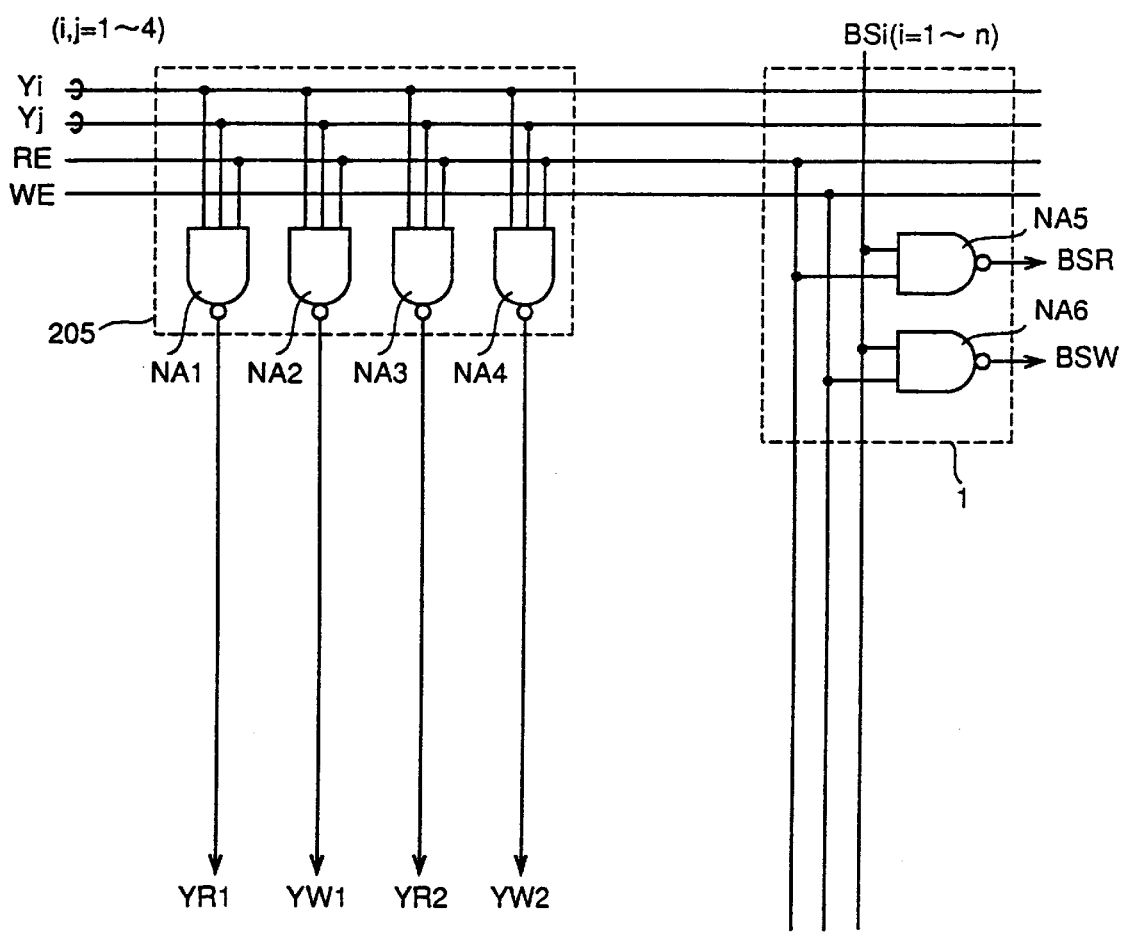
FIG. 4 shows circuits for generating various control signals shown in the diagram of FIG. 3.

FIG. 3 is a specific circuit diagram of the first embodiment of the present invention which includes a plurality of bit line pairs and a plurality of segment data line pairs. FIG. 4 shows circuits for generating signals applied in the circuit of FIG. 3.

Referring to FIG. 3, in the structure of this example, 2 bits of data are stored in sub memory array 201a-1. More specifically, four pairs of bit lines BL1a, BL1b to BL4a and BL4b are provided in sub memory array 201a-1, and memory cells MC1 to MC4 are respectively provided at crossings between the bit lines and a word line WL0. At end portions of respective bit line pairs, sense amplifiers SA1 to SA4 and read amplifiers RAS1 to RAS4 are provided respectively. These are connected to two pairs of segment data lines for reading, SRB1a, SRB1b and SRB2a and SRB2b, and to two pairs of segment data lines for writing, SWB1a, SWB1b and SWB2a and SWB2b, respectively. Segment data line pairs for reading and segment data line pairs for writing are arranged alternately and parallel to the sub memory arrays, in a space along the longitudinal direction (in which bit lines are arranged) of each of the sub memory arrays. To a transfer gate provided between bit line pairs BL1a, BL1b and BL2a, BL2b and segment data line pair for writing, column data signal YW1 for writing is connected. Column decoder signal YR1 for reading is input to read amplifiers RAS1 and RAS2. More specifically, 2 bits of data are stored by bit line pairs BL1 and BL2. Similarly, column decoder signal YW2 for writing and column decoder signal YR2 for writing are respectively input to read amplifiers RAS3 and RAS4 of two pairs of bit lines BL3 and BL4.

Segment data line pairs SRB1a, SRB1b and SRB2a, SRB2b for reading are connected to two pairs of global data lines GRB1a, GRB1b and GRB2a, GRB2b, through read amplifiers RAG1 and RAG2, respectively. Sub memory array selecting signal BSR for reading is input to each of read amplifiers RAG1 and RAG2. Meanwhile, segment data pairs SWB1a, SWB1b and SWB2a and SWB2b for writing are connected to two pairs of global data lines for writing, that is, GWB1a, GWB1b and GWB2a and GWB2b, through four transistors to each of which sub memory array selecting signal BSW for writing is input. The global data lines for reading and global data lines for writing are arranged alternately, and as shown in the conventional example of FIG. 14, arranged along the sub memory arrays in a space in the lateral direction (parallel to the direction of arrangement of the bit lines) between each of the sub memory arrays.

Reading and writing operations in this structure are the same as those in the data line structure of FIG. 1, and therefore description thereof is not repeated.

Figure 14:
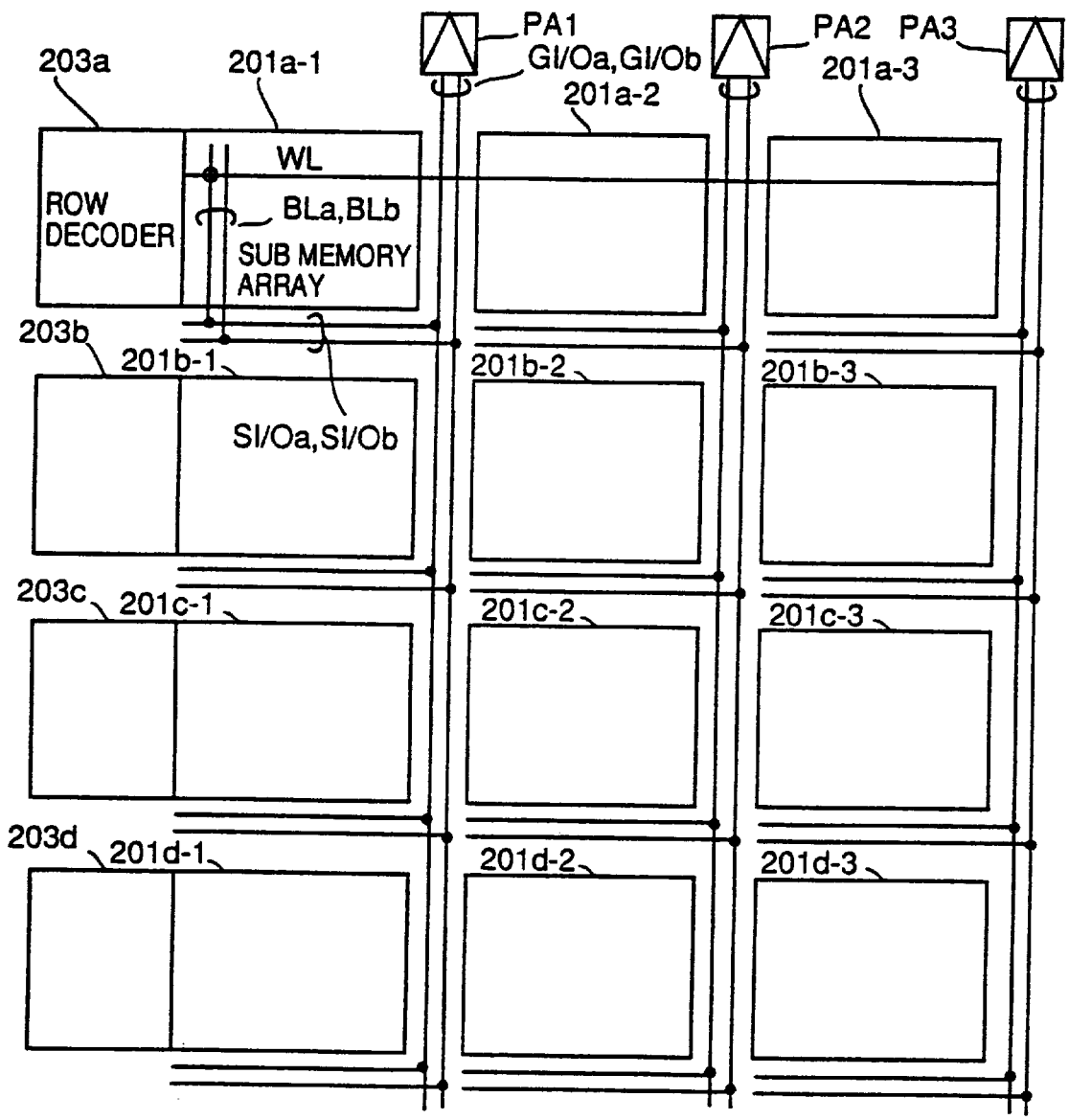
FIG. 14 shows a structure of a conventional DRAM in which a memory array is divided into a plurality of sub memory arrays.

Referring to FIG. 4, a column decoder 205 generating a column decoder signal includes NAND circuits NA1 to NA4, to each of which a signal Yi (i=1–4), a signal Yj (j=1–4), a read enable signal RE and a write enable signal WE are input in the manner as shown in the figure. Meanwhile, a selection signal generating circuit 1 generating a sub memory array signal includes two NAND circuits NA5 and NA6, to which a signal BSi (i=1–n) corresponding to the row address, read enable signal RE and write enable signal WE are input in the manner as shown. More specifically, the signal BSi may be generated corresponding to a signal for driving a corresponding row decoder in each sub memory array, shown in FIG. 14. In this manner, as shown in FIG. 14, data stored in a desired sub memory array is externally output, and data can be taken from the outside to a desired memory cell of a desired sub memory array.

Figure 5:
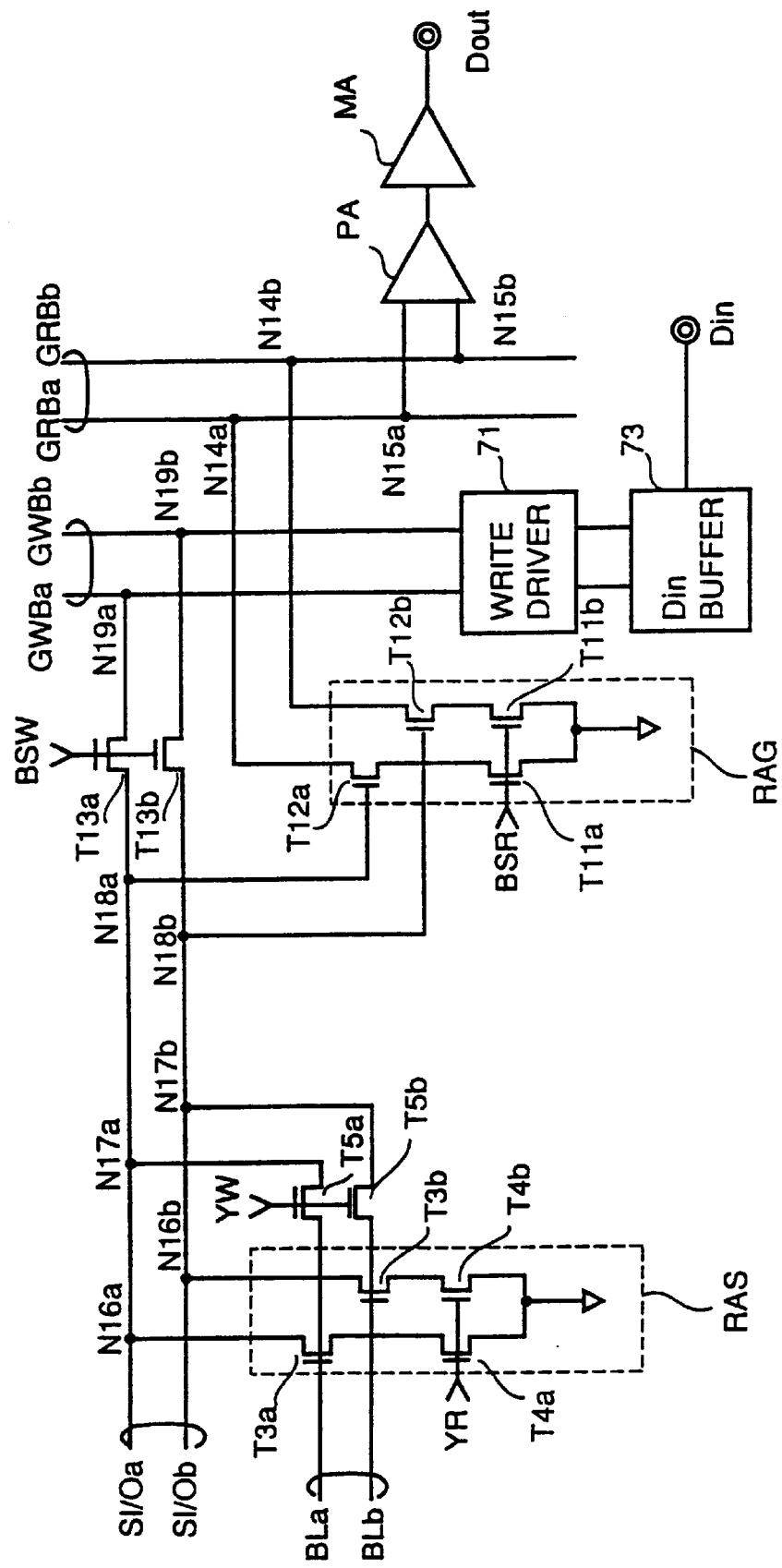
FIG. 5 shows a hierarchical data line structure in accordance with a second embodiment of the present invention.

FIG. 5 shows a hierarchical data line structure in accordance with the second embodiment of the present invention. The data line structure of the second embodiment differs from the first embodiment in that segment data lines for reading/writing are provided as segment line data pair SI/Oa, SI/Ob used commonly for reading and writing. Except this point, the structure is the same as that of the first embodiment shown in FIG. 1. More specifically, nodes N16a and N16b of the segment data line pair are connected to read amplifier RAS, and nodes N17a and N17b are connected to bit lines BLa and BLb through transfer gates T5a and T5b, respectively. End portions of segment data line pair are connected to nodes N19a and N19b of global data line pair GWBa and GWBb for writing, through transfer gates T13a and T13b. Nodes N18a and N18b of segment data line pair are connected to read amplifier RAG.

In this manner, since segment data line pair is a pair of data lines commonly used for read and write operations, the additional capacitance of segment data lines is increased by the amount of transfer gates T5a, T5b and T13a and T13b added, as compared with the segment data line pairs SRBa and SRBb for reading shown in FIG. 1. Therefore, the data line structure of this embodiment is less advantageous in view of access time, than the structure of the first embodiment. However, if the additional capacitance of the segment data line pair itself is small, for example when the segment data line pair is short, the influence on the access time is small. Since there is only one pair of segment data lines in the second embodiment, the area occupied by the segment data line pair can be reduced as compared with the first embodiment.

Figure 6:
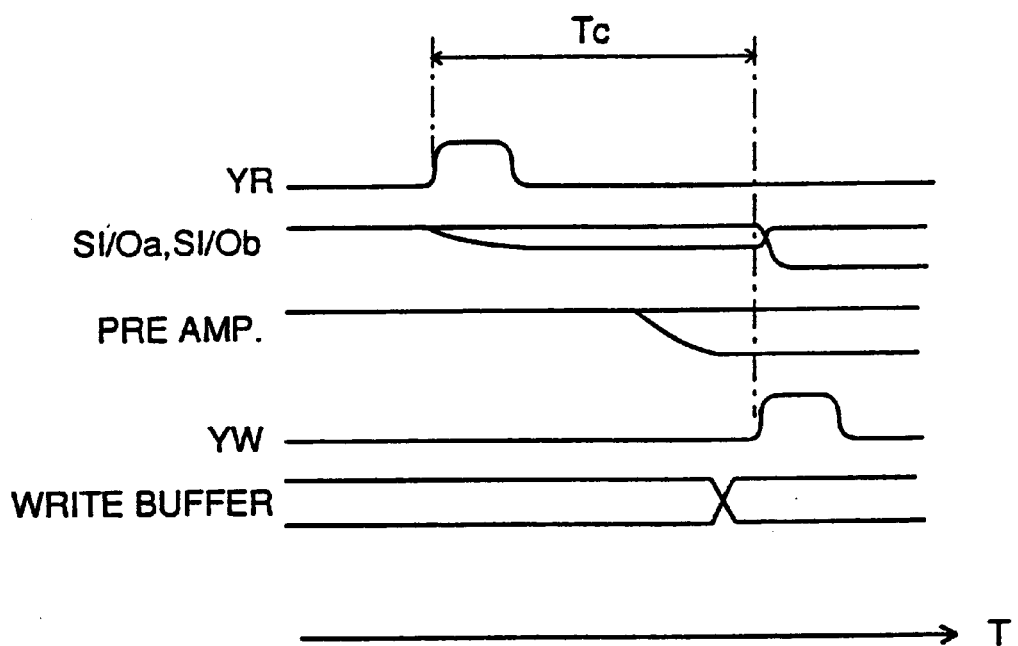
FIG. 6 is a timing chart showing transition time in the hierarchical data line structure in accordance with the second embodiment of the present invention.

The transition time necessary for switching from reading operation to the writing operation in the data line structure in accordance with the second embodiment will be described with reference to the time chart of FIG. 6, in comparison with the first embodiment.

In the second embodiment, the segment data line pair is commonly used for reading and writing operations. Therefore, even when the data appeared on bit line pair BLa and BLb is amplified and appears at segment data line pair SI/Oa and SI/Ob, the segment data line pair must hold the read data until the potential difference is amplified by preamplifier PA through RAG and the amplified potential difference is latched therein. Writing operation cannot be started until the data is amplified by preamplifier PA and latched. Therefore, the transition time Tc is as shown in the figure. Meanwhile, in the first embodiment described above, operation can be switched from the reading operation to the writing operation when the data at the bit line pair BLa and BLb is amplified by read amplifier RAS, appears at the segment data line pair SRBa and SRBb for reading and latched. Therefore, as compared with the first embodiment, transition time in the second embodiment is slightly longer. However, compared with the transition time in the conventional example of FIG. 16 (see (2) of FIG. 2), the transition time in the second embodiment is shorter than the prior art.

Figure 7:
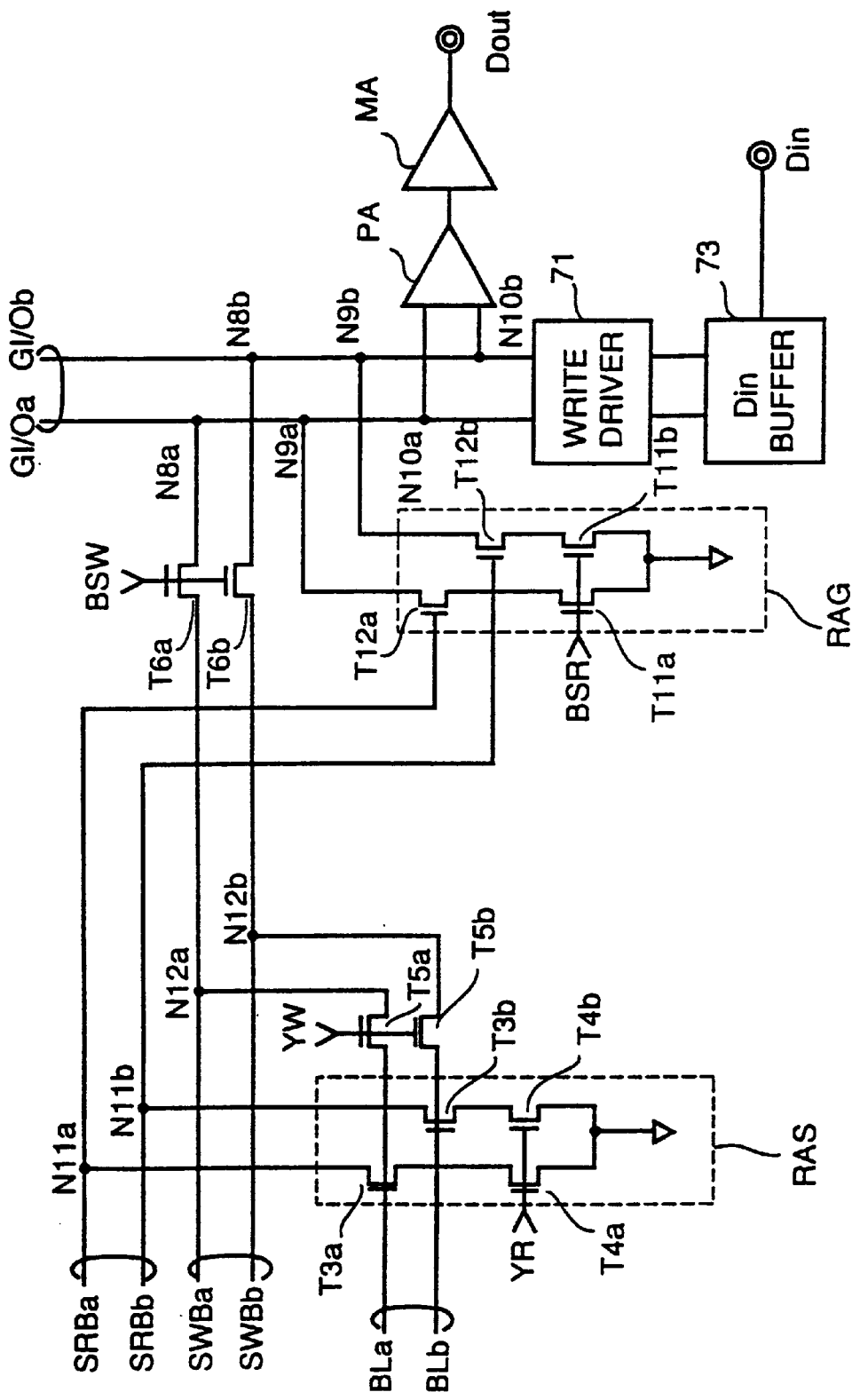
FIG. 7 shows a hierarchical data line structure in accordance with a third embodiment of the present invention.

FIG. 7 shows a hierarchical data line structure in accordance with the third embodiment of the present invention.

This embodiment differs from the first embodiment in that two pairs of global data lines for reading and writing in the first embodiment are replaced by a global data line pair commonly used for reading and writing. Except this point, the structure is the same as the first embodiment. More specifically, at nodes N8a and N8b, segment data line pair SWBa and SWBb for writing are connected to global data pair GI/Oa and GI/Ob, and segment data line pair SRBa and SRBb for reading are connected through read amplifier RAG to nodes N9a and N9b, respectively. Preamplifier PA for reading and write buffer 71 for writing are connected to the global data line pair.

When the global data line pair GI/Oa and GI/Ob of this structure are viewed as data lines of global data line pair GRBa and GRBb for reading in the first embodiment, the additional capacitance of the global data line pair is increased than the first embodiment, due to the write buffer 71 added. Therefore, in operation, it is less advantageous in view of access time as compared with the first embodiment. Further, transition time between the reading and writing operations is little longer than the first embodiment. However, if the additional capacitance of the global data line pair itself is small, as in the case where the global data line pair is short, the influence on the access time is small. In such a case, as the number of global data line pairs is reduced to half that of the first embodiment, the area occupied by the global data line pairs can be reduced.

Figure 8:
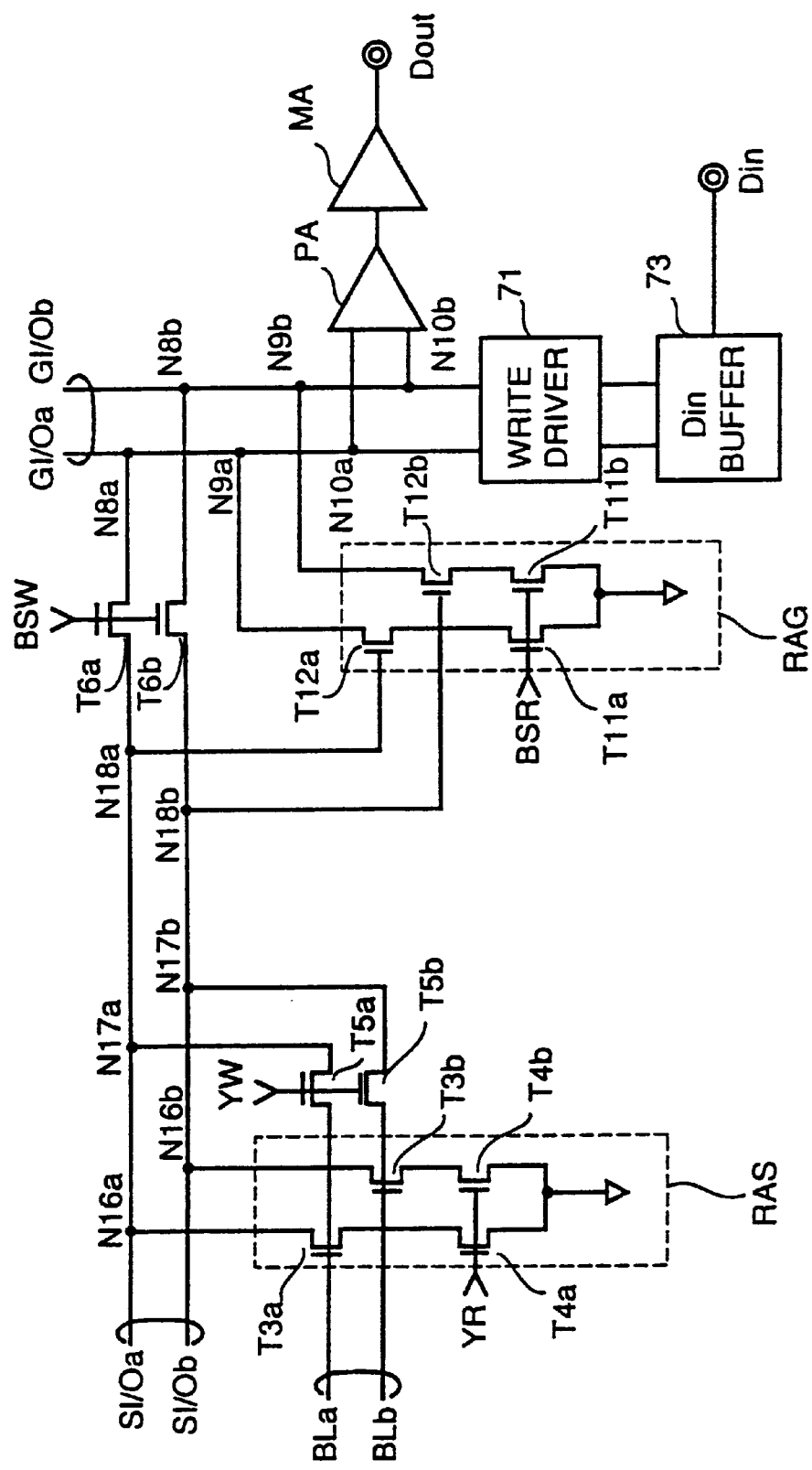
FIG. 8 shows a hierarchical data line structure in accordance with a fourth embodiment of the present invention.

FIG. 8 shows a hierarchical data line structure in accordance with the fourth embodiment of the present invention.

In this embodiment, segment data line pairs and global data line pairs of the first embodiment are replaced by segment data line pair SI/Oa, SI/Ob and global data line pair GI/Oa and GI/Ob which are commonly used for reading and writing operations. In this structure, as mentioned with respect to the embodiment above, the additional capacitances of segment data line pair and the global data line pair are increased as compared with the additional capacitance of the first embodiment, and therefore it is less advantageous in view of access time in reading and writing operations, and transition time necessary for switching from the reading operation to the writing operation is increased. However, if the additional capacitance of the segment data line pair itself is small as in the case where segment data line pair is short, or if the additional capacitance of the global data line pair itself is small as in the case where the global data line pair is short, the influence on the access time is small. In such a case, as the number of necessary segment data line pairs and of the global data line pairs can be reduced to half that of the first embodiment, the area occupied by the segment data line pairs and the global data line pairs can be reduced.

Figure 9:
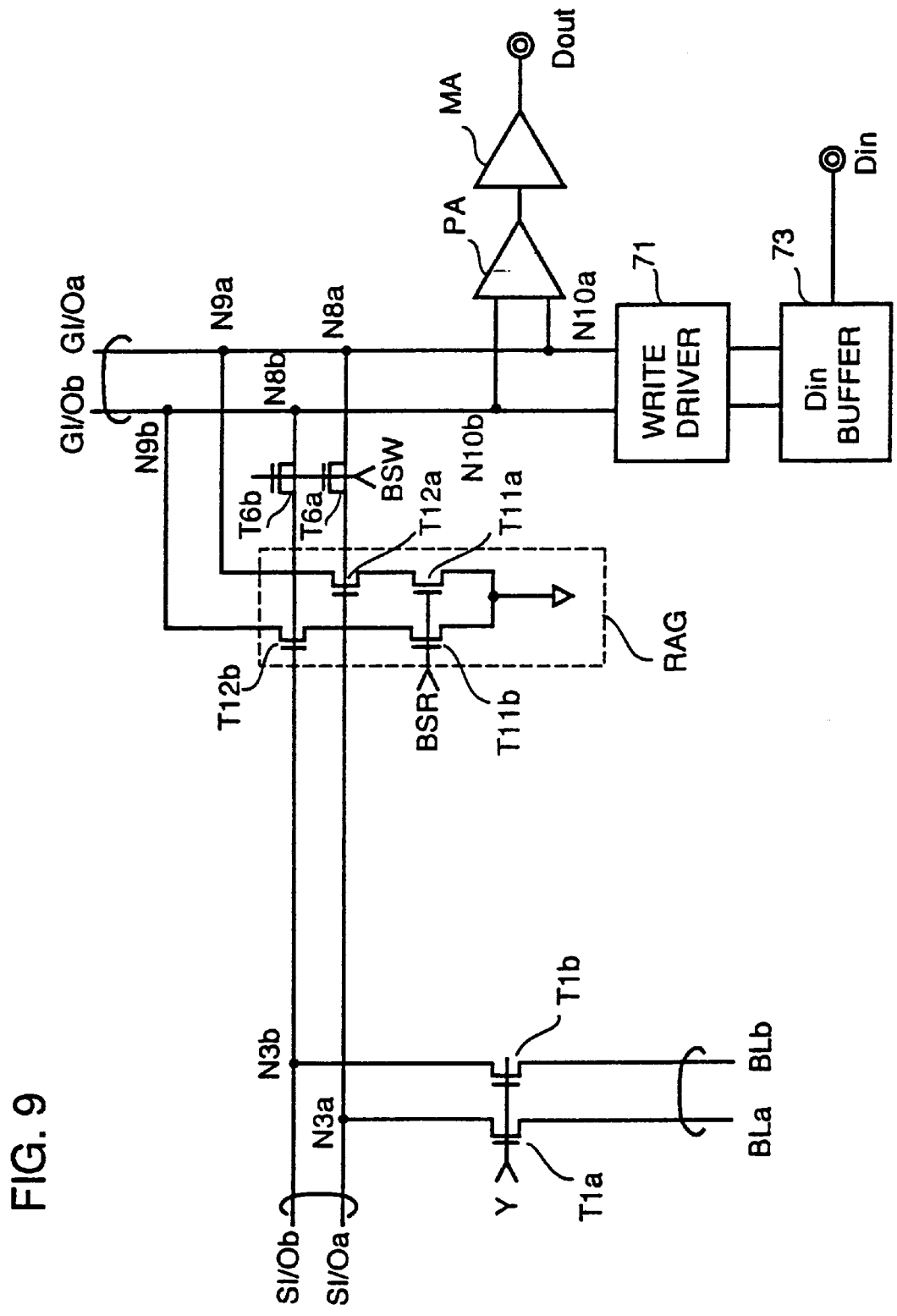
FIG. 9 shows a hierarchical data line structure in accordance with a fifth embodiment of the present invention.

FIG. 9 shows a hierarchical data line structure in accordance with the fifth embodiment of the present invention. This embodiment differs from the fourth embodiment shown in FIG. 8 in that read amplifier RAS is omitted. More specifically, bit line pair BLa and BLb are connected at nodes N3a and N3b to segment data line pair SI/Oa and SI/Ob which are commonly used for reading and writing, through transfer gates T1a and T1b. In this embodiment, since read amplifier is not provided, the amplification at the segment data line pair based on the data appearing at the bit line pair is delayed. However, additional capacitance of the segment data line pair can be reduced as compared with the fourth embodiment, and area occupied by the segment data line pair can be reduced thanks to the omission of read amplifier RAS.

Figure 10:
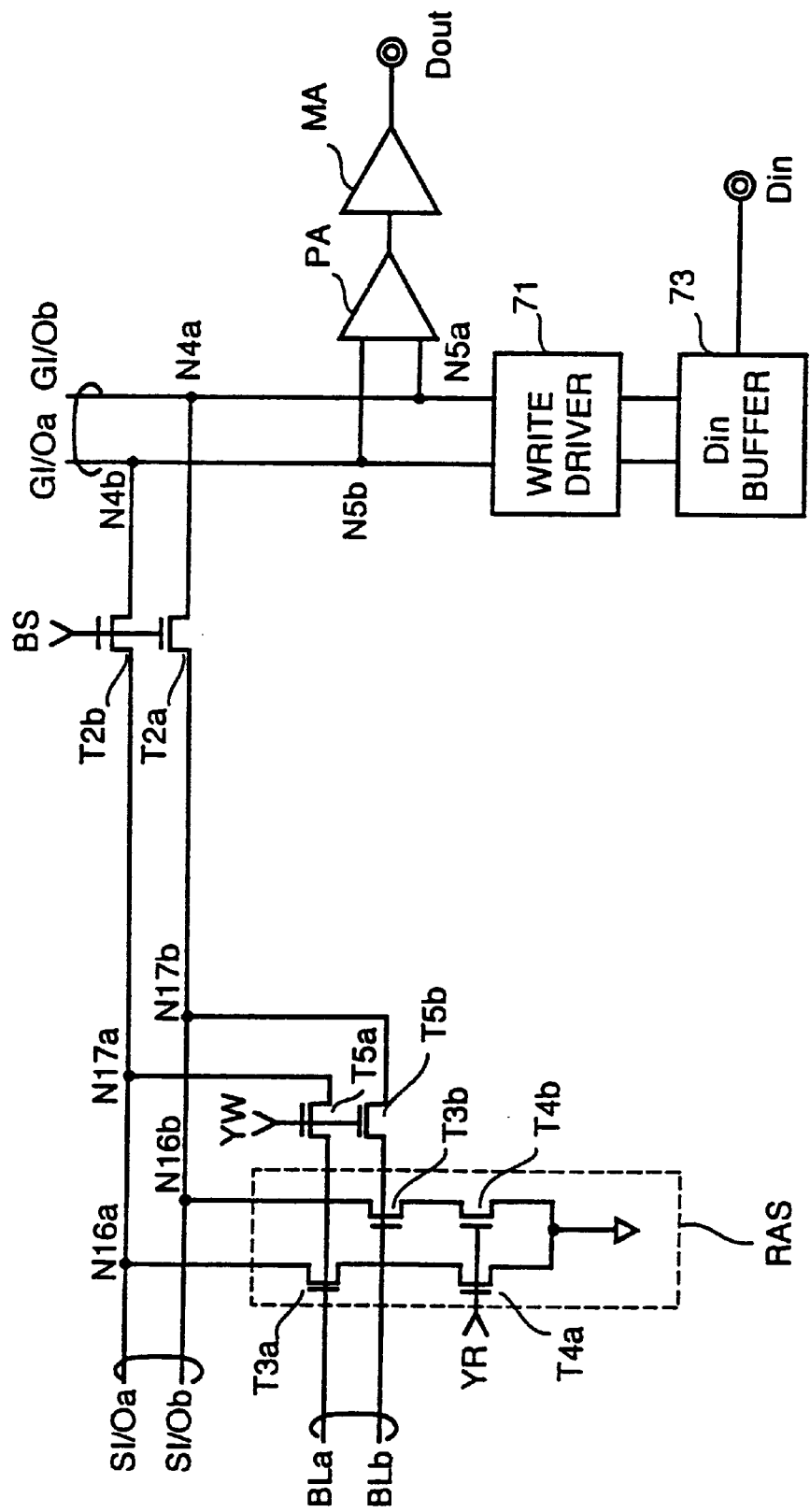
FIG. 10 shows a hierarchical data line structure in accordance with a sixth embodiment of the present invention.
Figure 11:
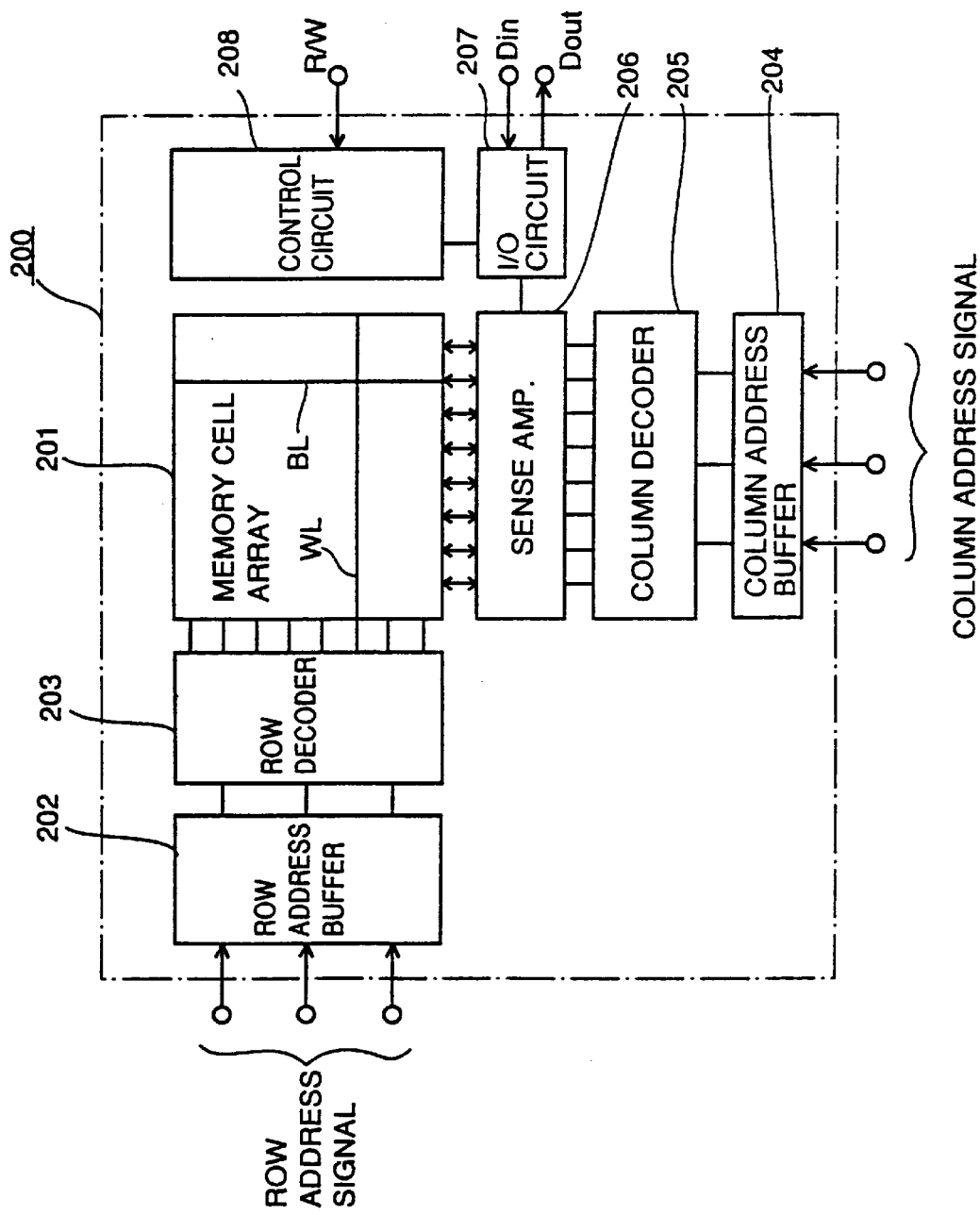
FIG. 11 is a block diagram showing a structure of a general DRAM.

FIG. 10 shows a hierarchical data line structure in accordance with a sixth embodiment of the present invention. This embodiment differs from the prior art example shown in FIG. 16 in that the segment data line pair is replaced by the segment data line pair SI/Oa and SI/Ob commonly used for reading and writing. As compared with the prior art example of FIG. 16, additional capacitance of the segment data line pair is increased, and therefore it is less advantageous in view of access time in reading and writing operations. Further, transition time necessary for switching from reading operation to writing operation is increased as compared with the prior art example of FIG. 16. However, if the additional capacitance of the segment data line itself is small as in the case where segment data line pair is short, the influence on the access time is small. Therefore, since the number of segment data line pairs can be reduced to half that of the prior art example shown in FIG. 16, the area occupied by the segment data lines can be reduced.

In the second to sixth embodiments above, structures based on a pair of bit lines corresponding to FIG. 1 of the first embodiment have been described. However, basically, the structures of FIGS. 3 and 4 of the first embodiment can similarly be applied to these embodiments. Circuits for generating various control signals may also be structured based on the concept of the first embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having hierarchical data line structure, comprising:

a first data line pair to which a plurality of memory cells and a sense amplifier are connected;

a second data line pair connected to said first data line pair, used for data writing;

a third data line pair connected to said first data line pair through a first read amplifier, used for data reading; and a fourth data line pair connected to said second data line pair and to said third data line pair through a second read amplifier, for externally taking/providing data.

2. A semiconductor memory device having hierarchical data line structure, comprising:

a first data line pair to which a plurality of memory cells and a sense amplifier are connected;

a second data line pair connected to said first data line pair, used for data writing/reading; and a third data line pair connected to said second data line pair and to said second data line pair through a read amplifier, for externally taking/providing data.

3. A semiconductor memory device comprising:

a bit line pair to which a plurality of memory cells and a sense amplifier are connected;

a first read amplifier having an input connected to said bit line pair;

a segment data line pair connected to an output of said first read amplifier, said segment data line pair transporting write data to said bit line pair in writing operation and transporting read data from said bit line pair in reading operation;

a first transfer circuit transferring data from said segment data line pair to said bit line pair when data writing; and a global data line pair connected to said segment data line.

4. The semiconductor memory device according to claim 3, wherein said global data line pair is a global read data line pair, and said semiconductor memory device further comprises:
- a global write data line pair;
- a second read amplifier having an input connected to said segment data line pair and having an output connected to said global read data line pair; and
- a second transferring circuit transferring data from said global write data line pair to said segment data line pair when data writing.

5. The semiconductor memory device according to claim 4, further comprising:

an output circuit externally providing data transmitted by said global read data line pair; and an input circuit providing externally applied data to said global write data line pair.

6. The semiconductor memory device according to claim 3, wherein said global data line pair transports data in both writing and reading operations; and said semiconductor memory device further comprises:
- a second read amplifier having an input connected to said segment data line pair and having an output connected to said global data line pair; and
- a second transfer circuit transferring data from said global data line pair to said segment data line pair when data writing.

7. The semiconductor memory device according to claim 6, further comprising:

an output circuit externally providing data transmitted by said global data line pair; and an input circuit providing externally applied data to said global data line pair.

8. The semiconductor memory device according to claim 3, wherein said global data line pair transports data in both writing and reading operations; and said semiconductor memory device further comprises a transistor pair connected between said segment data line pair and said global line pair.

9. The semiconductor memory device according to claim 1, further comprising:

a transfer circuit transferring data from said fourth data line pair to said second data line pair when data writing.

10. The semiconductor memory device according to claim 9, further comprising:

an output circuit externally providing data transmitted by said fourth data line pair; and an input circuit providing externally applied data to said fourth data line pair.

11. The semiconductor memory device according to claim 1, further comprising:

a transistor pair connected between said second data line pair and said fourth data line pair.

12. The semiconductor memory device according to claim 11, further comprising:

an output circuit externally providing data transmitted by said fourth data line pair; and an input circuit providing externally applied data to said fourth data line pair.

13. The semiconductor memory device according to claim 1, wherein:

said second data line pair is connected to said first data line pair through a transistor pair connected therebetween.

14. The semiconductor memory device according to claim 1, wherein said first read amplifier includes first and second transistors connected in series between ground and one line of said third data line pair, and third and fourth transistors connected in series between ground and another line of said third data line pair, where:

one line of said first data line pair is connected to a gate of the first transistor, another line of said second data line pair is connected to a gate of the third transistor, and a control signal input line is connected to gates of the second and fourth transistors.

15. A semiconductor memory device comprising:

a bit line pair to which a plurality of memory cells and a sense amplifier are connected;

a read amplifier having a pair of inputs connected to said bit line pair;

a segment read data line pair connected to a pair of outputs of said read amplifier, and transporting read data from said read amplifier in reading operation;

a segment write data line pair transporting write data to said bit line pair in writing operation;

a transfer circuit transferring data from said segment write data line pair to said bit line pair in the writing operation;

a global data line pair;

a discharge circuit discharging said global data line pair in response to read data transported by said segment read data line pair; and a gate circuit applying write data responsive to data transported by said global data line pair to said segment write data line pair.

16. The semiconductor memory device according to claim 15, further comprising:

an output circuit externally providing data transported by said global data line pair; and an input circuit providing externally applied data to said global data line pair.

17. The semiconductor memory device according to claim 15, wherein:

said read amplifier includes first and second transistors connected in series between ground and one output of the pair of outputs of said read amplifier, and third and fourth transistors connected in series between ground and another output of the pair of outputs, wherein one line of said bit line p is connected to a gate of the first transistor, another line of said bit line pair is connected to a gate of the third transistor, and a control signal input line is connected to gates of the second and fourth transistors.

18. The semiconductor memory device according to claim 15, wherein:

said transfer circuit includes a transistor pair coupled between said bit line pair and said segment write data line pair.

19. The semiconductor memory device according to claim 15, wherein:

said discharge circuit includes a transistor pair coupled between said global data line pair and ground, the transistor pair being responsive to read data transported by said segment read data line pair.

* * * * *

UNITED STATES PATENT AND TRADEMARK OFFICE
CERTIFICATE OF CORRECTION

PATENT NO. : 5,959,918
DATED : September 28, 1999
INVENTOR(S) : Kazutami Arimoto It is certified that error appears in the above-identified patent and that said Letters Patent is hereby corrected as shown below:

Column 12, lines 43 through 65: Claims 2 and 3 in their entirety are deleted from the Deed of Letters Patent.

Column 12, lines 66 and 67 through column 13, lines 1 through 38: Claims 4, 5, 6, 7 and 8 in their entirety are deleted from the Deed of Letters Patent.

Column 14, line 48: change "p" to --pair--.

Signed and Sealed this

Eleventh Day of July, 2000

Attest:

Q. TODD DICKINSON

*Attesting Officer*      *Director of Patents and Trademarks*